United States Patent
Kurachi

(10) Patent No.: US 8,952,491 B2
(45) Date of Patent: Feb. 10, 2015

(54) CAPACITIVE ELEMENT

(71) Applicant: Sumitomo Electric Device Innovations, Inc., Yokohama-shi, Kanagawa (JP)

(72) Inventor: Shunsuke Kurachi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 57 days.

(21) Appl. No.: 13/690,241

(22) Filed: Nov. 30, 2012

(65) Prior Publication Data

US 2013/0134555 A1    May 30, 2013

(30) Foreign Application Priority Data

Nov. 30, 2011   (JP) .................. 2011-262691

(51) Int. Cl.
*H01L 21/02* (2006.01)
*H01L 29/92* (2006.01)
*H01L 49/02* (2006.01)

(52) U.S. Cl.
CPC ............... *H01L 29/92* (2013.01); *H01L 28/40* (2013.01)
USPC ....................................... 257/532

(58) Field of Classification Search
CPC ...................................... H01L 29/92
USPC .......................................... 257/532
See application file for complete search history.

(56) References Cited

U.S. PATENT DOCUMENTS

| | | | |
|---|---|---|---|
| 2004/0041191 A1* | 3/2004 | Park et al. | 257/303 |
| 2005/0152094 A1* | 7/2005 | Jeong et al. | 361/312 |
| 2005/0230784 A1* | 10/2005 | Yang et al. | 257/532 |
| 2006/0128092 A1* | 6/2006 | Rouse | 438/239 |
| 2006/0180842 A1* | 8/2006 | Shibata et al. | 257/300 |
| 2007/0048953 A1* | 3/2007 | Gealy et al. | 438/305 |
| 2007/0102742 A1* | 5/2007 | Kil et al. | 257/295 |

FOREIGN PATENT DOCUMENTS

JP   2007-180425 A   7/2007

\* cited by examiner

*Primary Examiner* — Lex Malsawma
(74) *Attorney, Agent, or Firm* — Westerman, Hattori, Daniels & Adrian, LLP

(57) ABSTRACT

A capacitive element includes: an upper electrode; a lower electrode; and a dielectric layer that is disposed between the upper electrode and the lower electrode, and includes a first film, a second film and a third film which are made of any one of silicon nitride and aluminum oxide and laminated from a side of the lower electrode in order, a composition ratio of any one of silicon and aluminum in each of the first film and the third film being larger than a corresponding composition ratio in the second film.

16 Claims, 8 Drawing Sheets

COMPOSITION RATIO OF SILICON

COMPOSITION
RATIO OF SILICON

COMPOSITION
RATIO OF SILICON

CAPACITIVE ELEMENT

CROSS-REFERENCE TO RELATED APPLICATION

This application is based upon and claims the benefit of priority of the prior Japanese Patent Application No. 2011-262691, filed on Nov. 30, 2011, the entire contents of which are incorporated herein by reference.

BACKGROUND (i) Technical Field
The present invention relates to a capacitive element.
(ii) Related Art
A MIM (Metal Insulator Metal) capacitor which formed a lower electrode, a dielectric film and an upper electrode on a substrate in order is used for an electronic circuit such as an integrated circuit. Japanese Patent Application Publication No. 2007-180425 discloses structure in which the MIM capacitor which sandwiched a SiN film between metal films is provided on the substrate.

SUMMARY

It is an object to provide a capacitive element that improves adhesion between electrodes and a dielectric layer.
According to an aspect of the present invention, there is provided a capacitive element including: an upper electrode; a lower electrode; and a dielectric layer that is disposed between the upper electrode and the lower electrode, and includes a first film, a second film and a third film which are made of any one of silicon nitride and aluminum oxide and laminated from a side of the lower electrode in order, a composition ratio of any one of silicon and aluminum in each of the first film and the third film being larger than a corresponding composition ratio in the second film.

DETAILED DESCRIPTION

A description will now be given of an exemplary embodiment with reference to the accompanying drawings.

Figure 1:
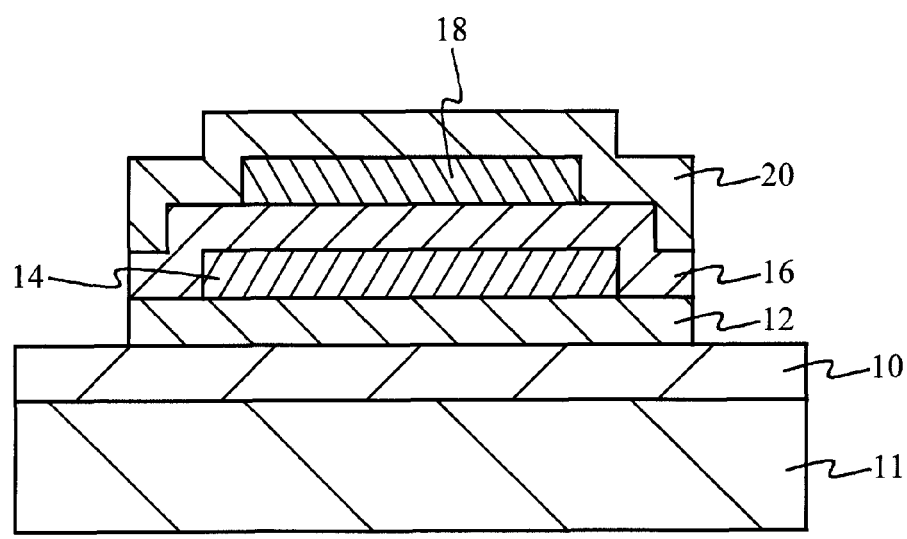
FIG. 1 is a cross-section view illustrating an example of a MIM capacitor according to a first embodiment.

(Embodiment 1) FIG. 1 is a cross-section view illustrating an example of a MIM capacitor according to a first embodiment. Referring to FIG. 1, an insulating film 12 is provided on a nitride semiconductor layer 10 formed on a substrate 11. The nitride semiconductor layer 10 is a laminated film including a GaN channel layer, an AlGaN electronic supply layer, and a GaN cap layer which are formed on the substrate 11 which is a SiC substrate, for example. Here, a nitride semiconductor is a III-V compound semiconductor including nitrogen, and is GaN, InN, AlN, AlGaN, InGaN, InAlN, AlInGaN or the like, for example. The insulating film 12 is a silicon nitride film, for example. The insulating film 12 can be formed using a sputtering method, a plasma CVD method (i.e., plasma chemical vapor deposition), for example.

A lower electrode 14 is provided on the insulating film 12. The lower electrode 14 can be formed using an evaporation method or the sputtering method. The lower electrode 14 is a laminated film in which Ti and Au are laminated in order from a side of the insulating film 12. For example, a laminated film in which TiW and Au are laminated in order from the side of the insulating film 12, or a laminated film in which Ti, Pt and Au are laminated in order from the side of the insulating film 12 can also be used as the lower electrode 14, except for the laminated film of Ti and Au. When the laminated film of Ti and Au, or TiW and Au is used, Ti or TiW may be further provided on Au. Thereby, a part in contact with the dielectric layer 16 becomes Ti or TiW, so that the adhesion with the dielectric layer 16 can be improved. In addition, when the laminated film of TiW and Au is used, TiWN may be provided between TiW and Au. Thereby, the adhesion between TiW and Au can be improved.

The dielectric layer 16 is provided so as to cover the lower electrode 14. The dielectric layer 16 is provided in contact with an upper surface of the lower electrode 14. The dielectric layer 16 is made of silicon nitride, but the details thereof are mentioned later. Here, the dielectric layer 16 is provided so as to cover the lower electrode 14, and an edge part of the dielectric layer 16 may be disposed on the insulating film 12. The dielectric layer 16 is provided on only the lower electrode 14, and the edge part of the dielectric layer 16 may be disposed on the lower electrode 14.

An upper electrode 18 is provided on the dielectric layer 16. The upper electrode 18 is provided in contact with an upper surface of the dielectric layer 16. The upper electrode 18 is a laminated film in which Ti and Au are laminated in order from a side of the dielectric layer 16. The upper electrode 18 can be formed using an evaporation method or the sputtering method, for example. For example, a laminated film in which TiW and Au are laminated in order from the side of the dielectric layer 16, or a laminated film in which Ti, Pt and Au are laminated in order from the side of the dielectric layer 16 can also be used as the upper electrode 18, except for the laminated film of Ti and Au. Thereby, a part in contact with the dielectric layer 16 becomes Ti or TiW, so that the adhesion with the dielectric layer 16 can be improved.

A protective film 20 is provided so as to cover the upper electrode 18. The protective film 20 is a silicon nitride film, a silicon dioxide film or a polyimide film. The protective film 20 can be formed using the sputtering method, the plasma CVD method or a spin-coated method, for example.

Figure 2A:
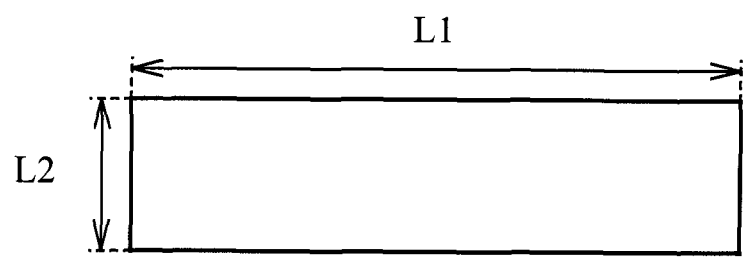
FIG. 2A is a plain view of a sample on which a peeling test is conducted.
Figure 2B:
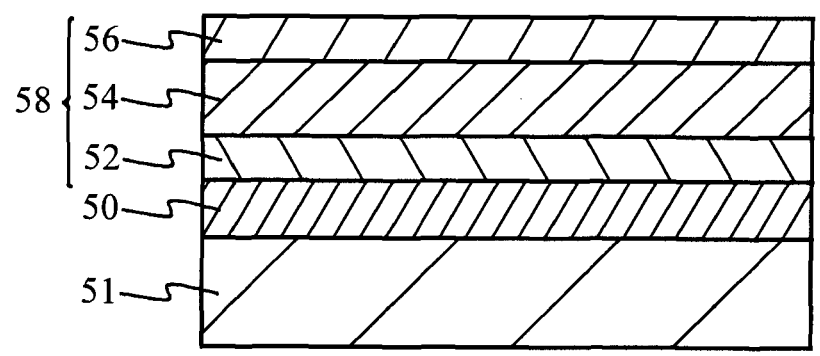
FIG. 2B is a cross-section view of FIG. 2A.

Here, before a description is given of the MIM of FIG. 1 in detail, an experiment which the inventor has conducted is explained. First, a description is given of a peeling test which the inventor has conducted. FIG. 2A is a plain view of a sample on which the peeling test is conducted, and FIG. 2B is a cross-section view of FIG. 2A. Referring to FIG. 2A, a long side L1 of the sample is 2.0 mm, and a short side L2 thereof is 0.5 mm. Referring to FIG. 2B, the sample has structure in which a metal film 50, and a dielectric layer 58 formed such that a first film 52, a second film 54 and a third film 56 are laminated are provided on a substrate 51 in order. A plurality of samples in which deposition conditions of the first film 52 and the third film 56 are changed have been manufactured as the above-mentioned sample. That is, the same metal film 50 and the same second film 54 are used for the plurality of samples. The metal film 50 is formed using the evaporation method or the sputtering method, and is a laminated film of Ti having 5 nm film thickness and Au having 200 nm film thickness. In this case, a lower layer is Ti and an upper layer is Au. The second film 54 is formed using the plasma CVD method, and is the silicon nitride film having 250 nm film thickness and the composition of $Si_3N_4$. Each of the first film 52 and the third film 56 is a silicon nitride film having any one of 5 nm, 50 nm and 60 nm film thickness, which is formed using the plasma CVD method. In the respective film thickness of the first film 52 and the third film 56, the composition ratio of silicon (i.e., composition ratio of Si and N) has been changed. Two-hundred samples in which the composition ratio of silicon is a certain value have been manufactured for each film thickness, and the peeling test has been conducted.

Figure 3:
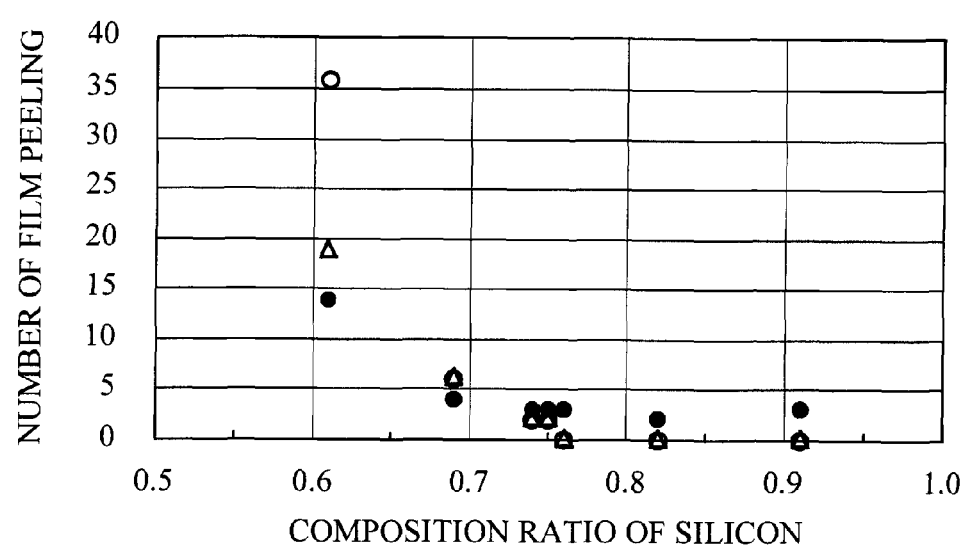
FIG. 3 illustrates a result of the peeling test.

FIG. 3 illustrates a result of the peeling test. A vertical axis indicates the number of samples which caused film peeling per 200 samples, and a horizontal axis indicates composition ratios of silicon in the first film 52 and the third film 56. A result in the case where the film thickness of each of the first film 52 and the third film 56 is 5 nm is illustrated by white circles. A result in the case where the film thickness of each of the first film 52 and the third film 56 is 50 nm is illustrated by white triangles. A result in the case where the film thickness of each of the first film 52 and the third film 56 is 60 nm is illustrated by black circles. Referring to FIG. 3, the film peeling decreases as the composition ratios of silicon in the first film 52 and the third film 56 increase, and when the composition ratios of silicon are equal to or more than 0.8, the film peeling almost disappears. This result indicates that it is desirable to make the composition ratios of silicon in the first film 52 and the third film 56 into 0.8 or more, it is more desirable to make the composition ratios thereof into 0.85 or more, and it is further desirable to make the composition ratios thereof into 0.9 or more, in order to restrain the film peeling. The film peeling is caused since the adhesion between the metal layer 50 and the first film 52 degrades. When the composition ratio of silicon in the first film 52 increases, the uncombined hand of silicon increases. Therefore, the uncombined hand combines with metal in the metal layer 50, and hence the adhesion between the metal layer 50 and the first film 52 is improved. Accordingly, the film peeling can be restrained by increasing the composition ratio of silicon in the first film 52.

Next, a description is given of a withstand voltage test which the inventor has conducted. The inventor has manufactured a plurality of samples. Each of the samples is a MIM capacitor which sandwiches a dielectric film made of silicon nitride between metal films, and in which the composition ratio of silicon in the dielectric film is changed for each sample. The metal films are formed using the evaporation method or the sputtering method, and are a laminated film of Ti having 5 nm film thickness and Au having 200 nm film thickness. In this case, a lower layer is Ti and an upper layer is Au. The dielectric film is formed using the plasma CVD method, and has 250 nm film thickness. The withstand voltage test has been conducted to the samples.

Figure 4:
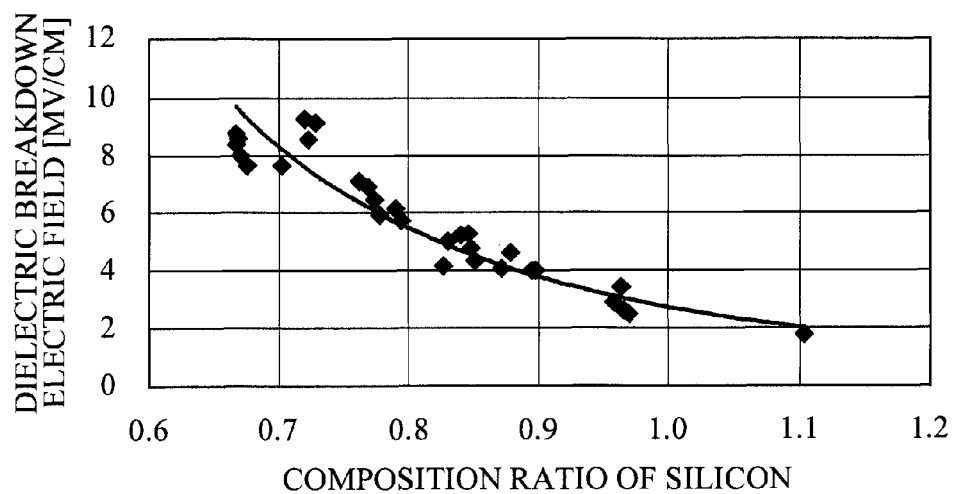
FIG. 4 illustrates a result of a withstand voltage test.

FIG. 4 illustrates a result of the withstand voltage test. A vertical axis indicates a dielectric breakdown electric field, and a horizontal axis indicates the composition ratio of silicon in the dielectric film. A solid line in FIG. 4 indicates an approximated curve of a measurement result. Referring to FIG. 4, the dielectric breakdown electric field decreases as the composition ratio of silicon in the dielectric film increases. Since a high withstand voltage capacitor is demanded, it is desirable that the dielectric breakdown electric field is equal to or more than 7 MV/cm, and it is more desirable that the dielectric breakdown electric field is equal to or more than 8 MV/cm. Therefore, it is desirable that the composition ratio of silicon in the dielectric film used as the capacitor is equal to or less than 0.75, and it is more desirable that the composition ratio thereof is equal to or less than 0.71.

Figure 5A:
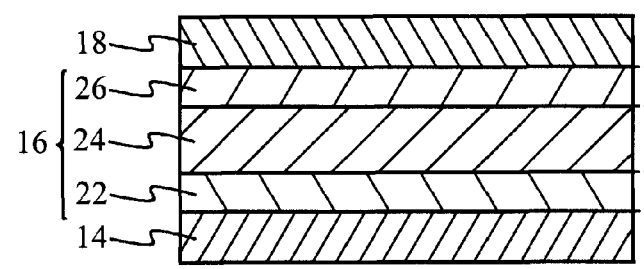
FIG. 5A is a cross-section view illustrating an example of a MIM of FIG. 1.
Figure 5B:
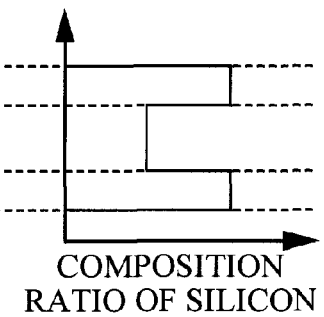
FIG. 5B is a view illustrating an example of a composition ratio of silicon in a dielectric layer.

The structure of the MIM of FIG. 1 determined based on the knowledge acquired in the above experiment is explained. FIG. 5A is a cross-section view illustrating an example of the MIM of FIG. 1, and FIG. 5B is a view illustrating an example of the composition ratio of silicon in a direction of the film thickness of the dielectric layer 16. Referring to FIG. 5A, in the dielectric layer 16 disposed between the lower electrode 14 and the upper electrode 18, a first film 22, a second film 24 and a third film 26 are laminated in order from the side of the lower electrode 14. The second film 24 is a dielectric film which mainly bears a role of the capacity and the withstand voltage of the capacitor, and is a silicon nitride film in which the composition ratio of silicon is equal to or less than 0.75. The film thickness of the second film 24 is changed according to the capacity, and is 150-250 nm, for example. Each of the first film 22 and the third film 26 is a dielectric film for improving the adhesion with the lower electrode 14 or the upper electrode 18, and is a silicon nitride film in which the composition ratio of silicon is equal to or more than 0.8. The film thickness of each of the first film 22 and the third film 26 is 5-50 nm.

Referring to FIG. 5B, the composition ratio of silicon in each of the first film 22 and the third film 26 is larger than that in the second film 24. The respective composition ratios of silicon in the first film 22, the second film 24 and the third film 26 are constant in the direction of the film thickness. The first film 22, the second film 24 and the third film 26 can be formed as films according to film forming gas conditions illustrated in a Table 1, using the plasma CVD method, for example.

TABLE 1

|  | $SiH_4$ | $NH_3$ | He | $N_2$ |
|---|---|---|---|---|
| FIRST FILM AND THIRD FILM | 3-10 cc | 0-2 cc | 400-900 cc | 100-600 cc |
| SECOND FILM | 3-10 cc | 3-15 cc | 400-900 cc | 100-600 cc |

According to the first embodiment, the dielectric layer 16 disposed between the lower electrode 14 and the upper electrode 18 is formed such that each of the first film 22 and the third film 26 has a composition ratio of silicon larger than the composition ratio of silicon in the second film 24, as illustrated in FIGS. 5A and 5B. Thereby, the second film 24 can be used as the dielectric film of the high withstand voltage capacitor, and the adhesion between the first film 22 and the lower electrode 14 and the adhesion between the third film 26 and the upper electrode 18 can be improved.

Also, when the lower electrode 14 is formed by the evaporation method or the sputtering method, concavity and convexity may be formed on the upper surface of the lower electrode 14. In such a case, by increasing the composition ratio of silicon in the first film 22 provided in contact with the lower electrode 14, a Si-Rich silicon nitride film is embedded in the concavity and convexity of the lower electrode 14. That is, the concavity and convexity of the lower electrode 14 is planarized with the Si-Rich silicon nitride film, and the second film 24 to be used as the dielectric film of the capacitor is formed thereon. The concentration of the electrical field by the concavity and convexity of the lower electrode 14 can be reduced, and dielectric breakdown can be restrained. Further, by increasing the composition ratio of silicon in the third film 26 provided in contact with the upper electrode 18, the concentration of the electrical field by a void can also be reduced, and the dielectric breakdown can be restrained.

As illustrated in FIG. 3, it is desirable that the composition ratios of silicon in the first film 22 and the third film 26 are equal to or more than 0.8, it is more desirable that the composition ratios thereof are equal to or more than 0.85, and it is further desirable that the composition ratios thereof are equal to or more than 0.9. Thereby the adhesion between the electrodes and the dielectric layer 16 can be improved, and the film peeling can be restrained. Moreover, the Si-Rich silicon nitride films in which the composition ratios of silicon are equal to or more than 0.8 are provided in contact with the lower electrode 14 and the upper electrode 18, and hence the concentration of the electrical field can be more reduced and the dielectric breakdown can be more restrained.

Since the second film is the dielectric film used as the capacitor, it is desirable that the composition ratio of silicon in the second film 24 are equal to or less than 0.75 in view of the withstand voltage, as illustrated in FIG. 4. It is more desirable that the composition ratio of silicon in the second film 24 are equal to or less than 0.71.

Although in the first embodiment, the description is given of, as an example, a case where the dielectric layer 16 made of silicon nitride is formed by the plasma CVD method, the dielectric layer 16 may be formed using another method such as the sputtering method or an ALD (Atomic Layer Deposition) method.

Although the description is given of, as an example, a case where each of the lower electrode 14 and the upper electrode 18 is the laminated film in which Ti and Au are laminated, each of the lower electrode 14 and the upper electrode 18 is made of another material, as described above. Each of the lower electrode 14 and the upper electrode 18 is not limited to the laminated film, and may be a single layer film.

Although the description is given of, as an example, a case where the MIM capacitor is provided on the nitride semiconductor layer 10, the MIM capacitor may be provided on a III-V compound semiconductor layer including arsenic, or a semiconductor layer such as a Si semiconductor layer. The III-V compound semiconductor layer including arsenic is GaAs, InAs, AlAs, AlGaAs, InGaAs, InAlAs, InAsGaAs or the like, for example.

(Embodiment 2) Since the cross-section view of the MIM capacitor according to a second embodiment is the same as FIG. 1, the drawing thereof is omitted here. The second embodiment differs from the first embodiment in that the dielectric layer 16 is made of aluminum oxide. Here, before a description is given of the MIM of the MIM capacitor according to the second embodiment, an experiment which the inventor has conducted is explained. First, a description is given of the peeling test which the inventor has conducted. The peeling test has been conducted by the same method as the method described in the first embodiment. That is, the plurality of samples in which deposition conditions of the first film 52 and the third film 56 are changed have been manufactured according to the structure illustrated in FIG. 2B. The same metal film 50 and the same second film 54 are used for the plurality of samples. The metal film 50 has the same structure as that illustrated in FIG. 2B. The second film 54 is formed using the sputtering method, and is an aluminum oxide film having 250 nm film thickness and the composition of $Al_2O_3$. Each of the first film 52 and the third film 56 is an aluminum oxide film having any one of 5 nm, 50 nm and 60 nm film thickness, which is formed using the sputtering method. In the respective film thickness of the first film 52 and the third film 56, the composition ratio of aluminum (i.e., composition ratio of Al and O) has been changed. Two-hundred samples in which the composition ratio of aluminum is a certain value have been manufactured for each film thickness, and the peeling test has been conducted.

Figure 6:
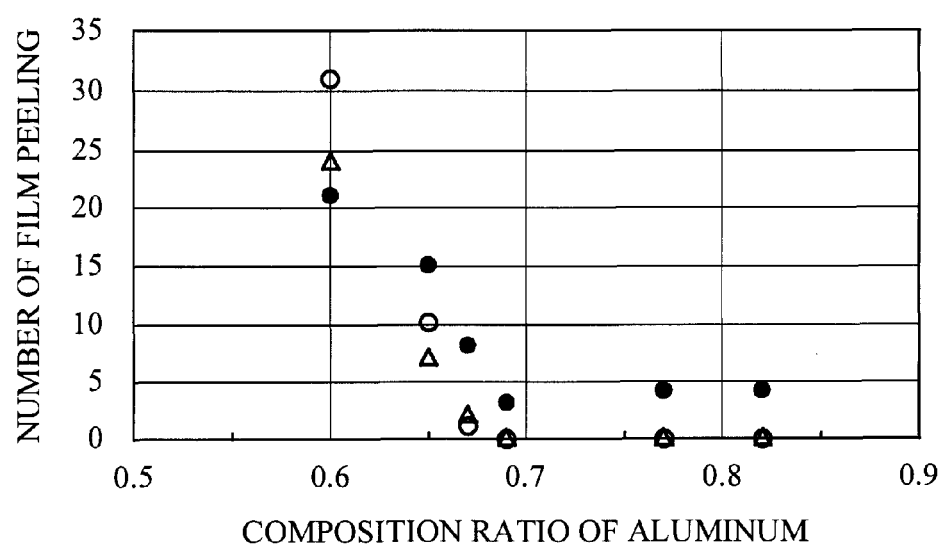
FIG. 6 illustrates a result of the peeling test according to a second embodiment.

FIG. 6 illustrates a result of the peeling test according to the second embodiment. A vertical axis indicates the number of samples which caused the film peeling per 200 samples, and a horizontal axis indicates composition ratios of aluminum in the first film 52 and the third film 56. A result in the case where the film thickness of each of the first film 52 and the third film 56 is 5 nm is illustrated by white circles. A result in the case where the film thickness of each of the first film 52 and the third film 56 is 50 nm is illustrated by white triangles. A result in the case where the film thickness of each of the first film 52 and the third film 56 is 60 nm is illustrated by black circles. Referring to FIG. 6, the film peeling decreases as the composition ratios of aluminum in the first film 52 and the third film 56 increase, and when the composition ratios of aluminum in the first film 52 and the third film 56 are equal to or more than 0.7, the film peeling almost disappears. This result indicates that it is desirable to make the composition ratios of aluminum in the first film 52 and the third film 56 into 0.7 or more, it is more desirable to make the composition ratios thereof into 0.75 or more, and it is further desirable to make the composition ratios thereof into 0.8 or more, in order to restrain the film peeling. The reason why the film peeling is restrained by increasing the composition ratio of aluminum in the aluminum oxide is the same as the reason described in FIG. 3

Next, a description is given of a withstand voltage test which the inventor has conducted. The withstand voltage test has been conducted by the same method as the method described in the first embodiment. That is, the inventor has manufactured a plurality of samples. Each of the samples is a MIM capacitor which sandwiches a dielectric film made of aluminum oxide between metal films, and in which the composition ratio of aluminum in the dielectric film is changed for each sample. The structure of the metal films is the same as that of the metal films described in the first embodiment. The dielectric film is formed using the sputtering method, and has 250 nm film thickness. The withstand voltage test has been conducted to the samples.

Figure 7:
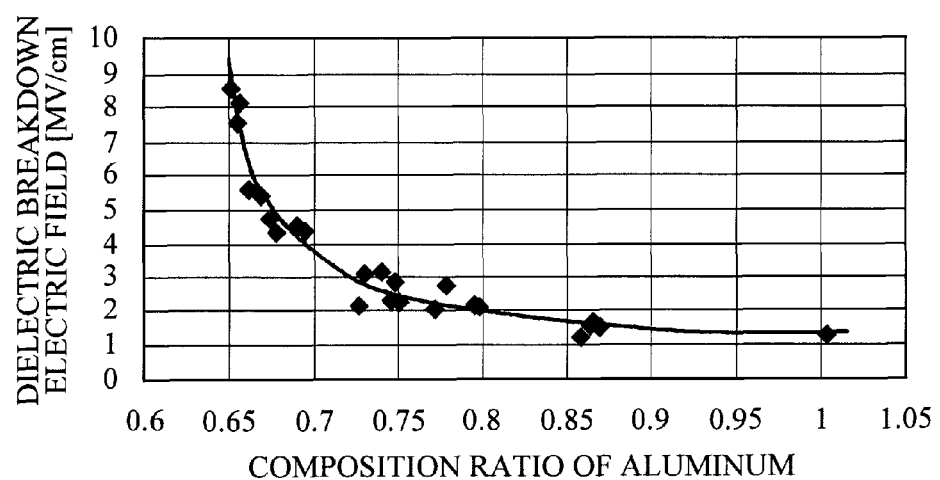
FIG. 7 illustrates a result of the withstand voltage test.

FIG. 7 illustrates a result of the withstand voltage test. A vertical axis indicates a dielectric breakdown electric field, and a horizontal axis indicates the composition ratio of aluminum in the dielectric film. A solid line in FIG. 7 indicates an approximated curve of a measurement result. Referring to FIG. 7, the dielectric breakdown electric field decreases as the composition ratio of aluminum in the dielectric film increases. Since the high withstand voltage capacitor is demanded as described above, it is desirable that the dielectric breakdown electric field is equal to or more than 7 MV/cm, and it is more desirable that the dielectric breakdown electric field is equal to or more than 8 MV/cm. Therefore, it is desirable that the composition ratio of aluminum in the dielectric film used as the capacitor is equal to or less than 0.66, and it is more desirable that the composition ratio thereof is equal to or less than 0.65.

The structure of the MIM of the MIM capacitor in the second embodiment determined based on the knowledge acquired in the above experiment is explained. A cross-section view of the MIM of the MIM capacitor in the second embodiment is the same as FIG. 5A, and the composition ratio of aluminum in a direction of the film thickness of the dielectric layer 16 is the same as a composition ratio when the horizontal axis of FIG. 5B is replaced with the composition ratio of aluminum. Therefore, the structure of the MIM of the MIM capacitor is explained with respect to FIGS. 5A and 5B. The second film 24 is a dielectric film which mainly bears a role of the capacity and the withstand voltage of the capacitor, and is an aluminum oxide film in which the composition ratio of aluminum is equal to or less than 0.66. The film thickness of the second film 24 is changed according to the capacity, and is 150-250 nm, for example. Each of the first film 22 and the third film 26 is a dielectric film for improving the adhesion with the lower electrode 14 or the upper electrode 18, and is an aluminum oxide film in which the composition ratio of aluminum is equal to or more than 0.7. The film thickness of each of the first film 22 and the third film 26 is 5-50 nm. The composition ratio of aluminum in each of the first film 22 and the third film 26 is larger than that in the second film 24. The respective composition ratios of aluminum in the first film 22, the second film 24 and the third film 26 are constant in the direction of the film thickness. The first film 22, the second film 24 and the third film 26 can be formed as films according to film forming gas conditions illustrated in a Table 2, by use of the sputtering method using an aluminum target, for example.

TABLE 2

|  | Ar | $O_2$ |
| --- | --- | --- |
| FIRST FILM AND THIRD FILM | 1-10 cc | 50-100 cc |
| SECOND FILM | 1-10 cc | 1-49 cc |

According to the second embodiment, the dielectric layer 16 is made of aluminum oxide, and is formed such that each of the first film 22 and the third film 26 has a composition ratio of aluminum larger than the composition ratio of aluminum in the second film 24. Also in this case, the second film 24 can be used as the dielectric film of the high withstand voltage capacitor, and the adhesion between the first film 22 and the lower electrode 14 and the adhesion between the third film 26 and the upper electrode 18 can be improved. Moreover, since the Aluminum-Rich aluminum oxide films are provided in contact with the lower electrode 14 and the upper electrode 18, the concentration of the electrical field can be reduced and the dielectric breakdown can be restrained even when there is the concavity and convexity on the upper surface of the lower electrode 14 or the lower surface of the upper electrode 18.

As illustrated in FIG. 6, it is desirable that the composition ratios of aluminum in the first film 22 and the third film 26 are equal to or more than 0.7, it is more desirable that the composition ratios thereof are equal to or more than 0.75, and it is further desirable that the composition ratios thereof are equal to or more than 0.8. Thereby the adhesion between the electrodes and the dielectric layer 16 can be improved, and the film peeling can be restrained. Moreover, the Aluminum-Rich aluminum oxide films in which the composition ratios of aluminum are equal to or more than 0.7 are provided in contact with the lower electrode 14 and the upper electrode 18, and hence the concentration of the electrical field can be more reduced and the dielectric breakdown can be more restrained.

Since the second film 24 is the dielectric film used as the capacitor, it is desirable that the composition ratio of aluminum in the second film 24 are equal to or less than 0.66 in view of the withstand voltage, as illustrated in FIG. 7. It is more desirable that the composition ratio of aluminum in the second film 24 are equal to or less than 0.65.

Although in the second embodiment, the description is given of, as an example, a case where the dielectric layer 16 made of aluminum oxide is formed by the sputtering method, the dielectric layer 16 may be formed using another method such as the plasma CVD method or the ALD (Atomic Layer Deposition) method.

Even when the dielectric layer 16 is made of any one of silicon nitride and aluminum oxide, it is desirable that the film thickness of each of the first film 22 and the third film 26 is equal to or more than 5 nm and equal to or less than 50 nm. This is because the adhesion with the electrode weakens when the film thickness of each of the first film 22 and the third film 26 becomes thinner than 5 nm. Moreover, this is because, when each of the first film 22 and the third film 26 is thicker than 50 nm, the stress of each film itself (i.e., each of the first film 22 and the third film 26) becomes strong, and the film peeling occurs easily as illustrated in the results of 60 nm film thickness in FIGS. 3 and 6 even when the composition ratio of silicon or aluminum is increased.

Figure 8A:
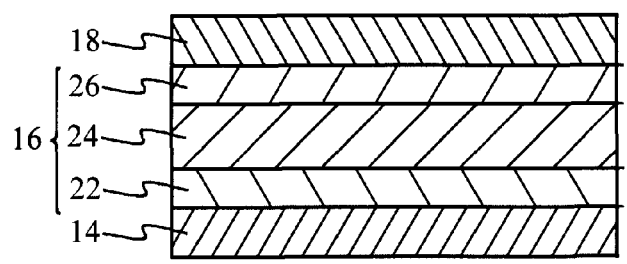
FIG. 8A is a cross-section view illustrating an example of the MIM of the MIM capacitor according to a third embodiment.
Figure 8B:
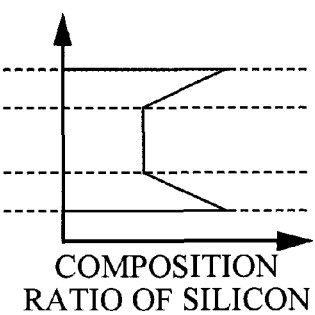
FIG. 8B is a view illustrating an example of the composition ratio of silicon in the dielectric layer.
Figure 8C:
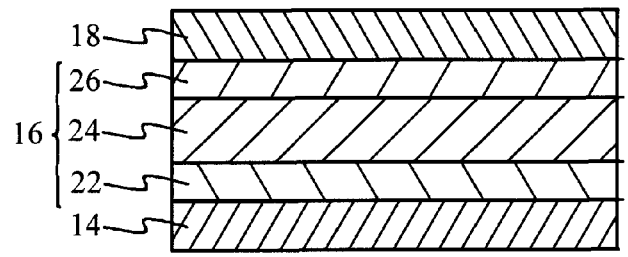
FIG. 8C is a cross-section view illustrating an example of the MIM of the MIM capacitor according to a variation 1 of the third embodiment.
Figure 8D:
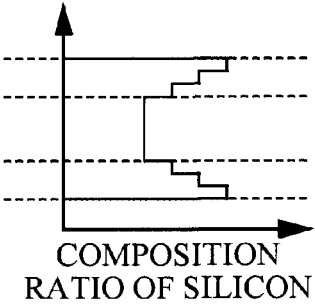
FIG. 8D is a view illustrating an example of the composition ratio of silicon in the dielectric layer.

(Embodiment 3) FIG. 8A is a cross-section view illustrating an example of the MIM of the MIM capacitor according to a third embodiment. FIG. 8B is a view illustrating an example of the composition ratio of silicon in the direction of the film thickness of the dielectric layer 16. FIG. 8C is a cross-section view illustrating an example of the MIM of the MIM capacitor according to a variation 1 of the third embodiment. FIG. 8D is a view illustrating an example of the composition ratio of silicon in the direction of the film thickness of the dielectric layer 16. Referring to FIGS. 8A and 8B, the third embodiment differs from the first embodiment in that the composition ratio of silicon in the first film 22 continuously increases toward the lower electrode 14 (i.e., in a direction approaching the lower electrode 14), and the composition ratio of silicon in the third film 26 continuously increases toward the upper electrode 18 (i.e., in a direction approaching the upper electrode 18). Referring to FIGS. 8C and 8D, the variation 1 of the third embodiment differs from the first embodiment in that the composition ratio of silicon in the first film 22 increases stepwise toward the lower electrode 14 (i.e., in the direction approaching the lower electrode 14), and the composition ratio of silicon in the third film 26 increases stepwise toward the upper electrode 18 (i.e., in the direction approaching the upper electrode 18). Other components are the same as corresponding components in the first embodiment, and a description thereof is omitted here.

As described in the third embodiment and the variation 1 of the third embodiment, the composition ratio of silicon in the first film 22 may be increased continuously or stepwise toward the lower electrode 14, and the composition ratio of silicon in the third film 26 may be increased continuously or stepwise toward the upper electrode 18. Also in this case, each of the first film 22 and the third film 26 is formed so as to have a composition ratio of silicon larger than the composition ratio of silicon in the second film 24, and hence the adhesion between the electrodes and the dielectric layer 16 can be improved. Moreover, the concentration of the electrical field can be reduced and the dielectric breakdown can be restrained even when there is the concavity and convexity on the upper surface of the lower electrode 14 or the lower surface of the upper electrode 18.

As described in the third embodiment and the variation 1 of the third embodiment, when the composition ratios of silicon in the first film 22 and the third film 26 are changed, it is desirable that the composition ratios of silicon in a part of the first film 22 in contact with the lower electrode 14 and a part of the third film 26 in contact with the upper electrode 18 are equal to or more than 0.8, it is more desirable that the composition ratios thereof are equal to or more than 0.85, and it is further desirable that the composition ratios thereof are equal to or more than 0.9, in view of the results of the peeling test in FIG. 3.

Also when the dielectric layer 16 is made of aluminum oxide, the composition ratio of aluminum in the first film 22 may be increased continuously or stepwise toward the lower electrode 14, and the composition ratio of aluminum in the third film 26 may be increased continuously or stepwise toward the upper electrode 18. In this case, it is desirable that the composition ratios of aluminum in a part of the first film 22 in contact with the lower electrode 14 and a part of the third film 26 in contact with the upper electrode 18 are equal to or more than 0.7, it is more desirable that the composition ratios thereof are equal to or more than 0.75, and it is further desirable that the composition ratios thereof are equal to or more than 0.8, in view of the results of the peeling test in FIG. 6.

Although the embodiments of the present invention are described in detail, the present invention is not limited to the specifically disclosed embodiments and variations but may include other embodiments and variations without departing from the scope of the present invention.

What is claimed is:

1. A capacitive element comprising:
an upper electrode;
a lower electrode;
concavity and convexity formed on an upper surface of the lower electrode; and
a dielectric layer that is disposed between the upper electrode and the upper surface of the lower electrode, and includes a first film, a second film and a third film which are made of any one of silicon nitride and aluminum oxide and laminated from a side of the lower electrode in order, a composition ratio of any one of silicon and aluminum in each of the first film and the third film being larger than a corresponding composition ratio in the second film, wherein the first film and the third film are made of silicon nitride, and composition ratios of silicon in a part of the first film in contact with the lower electrode and a part of the third film in contact with the upper electrode are equal to or more than 0.8, or the first film and the third film are made of aluminum oxide, and composition ratios of aluminum in a part of the first film in contact with the lower electrode and a part of the third film in contact with the upper electrode are equal to or more than 0.7, and wherein
the composition ratio of any one of silicon and aluminum in the first film increases continuously or stepwise toward the lower electrode, and the composition ratio of any one of silicon and aluminum in the third film increases continuously or stepwise toward the upper electrode.

2. The capacitive element as claimed in claim 1, wherein the second film is made of silicon nitride, and a composition ratio of silicon in the second film is equal to or less than 0.75.

3. The capacitive element as claimed in claim 1, wherein the second film is made of aluminum oxide, and a composition ratio of aluminum in the second film is equal to or less than 0.66.

4. The capacitive element as claimed in claim 1, wherein a film thickness of each of the first film and the third film is equal to or more than 5 nm and equal to or less than 50 nm.

5. The capacitive element as claimed in claim 1, wherein the composition ratio of any one of silicon and aluminum in each of the first film and the third film is constant in a direction of a film thickness.

6. The capacitive element as claimed in claim 1, wherein a material of at least one of the upper electrode and the lower electrode in contact with the dielectric layer is Ti or TiW.

7. The capacitive element as claimed in claim 1, wherein the lower electrode is formed on a nitride semiconductor layer.

8. The capacitive element as claimed in claim 1, wherein the dielectric layer is formed by a plasma CVD method, a sputtering method or an ALD (Atomic Layer Deposition) method.

9. The capacitive element as claimed in claim 1, wherein the second film is made of silicon nitride, and a composition ration of silicon in the second film is equal to or less than 0.71.

10. The capacitive element as claimed in claim 1, wherein the second film is made of aluminum oxide, and a composition ration of aluminum in the second film is equal to or less than 0.65.

11. A capacitive element comprising:
an upper electrode;
a lower electrode;
concavity and convexity formed on an upper surface of the lower electrode;
a first dielectric film;
the first dielectric film provided in contact with the upper surface of the lower electrode;
a second dielectric film;
a third dielectric film;
the third dielectric film provided in contact with an underside surface of the upper electrode; and
a protective film that is provided so as to cover a surface of the upper electrode and is provided in contact with an upper surface of the third dielectric film except for a portion where the upper electrode and the third dielectric film are in contact,
a peeling strength between any one of the first dielectric film and the third dielectric film and a material of any one of the upper electrode and the lower electrode is higher than that of the second dielectric film.

12. The capacitive element as claimed in claim 11, wherein a breakdown voltage of the second dielectric film is higher than that of each of the first dielectric film and the third dielectric film.

13. A capacitive element comprising:
an upper electrode;
a lower electrode; and
a dielectric layer that is disposed between the upper electrode and the lower electrode, and includes a first film, a second film and a third film which are made of any one of silicon nitride and aluminum oxide and laminated from a side of the lower electrode in order, a composition ratio of any one of silicon and aluminum in each of the first film and the third film being larger than a corresponding composition ratio in the second film,
wherein the dielectric layer is provided so as to cover an entire top surface and all side surfaces of the lower electrode.

14. The capacitive element as claimed in claim 13, further comprising a protective film that is provided so as to cover a surface of the upper electrode.

15. A capacitive element comprising:
an upper electrode;
a lower electrode;
a first dielectric film;
a second dielectric film; and
a third dielectric film,
a peeling strength between any one of the first dielectric film and the third dielectric film and a material of any one of the upper electrode and the lower electrode is higher than that of the second dielectric film,
wherein the first dielectric film, the second dielectric film and the third dielectric film is provided so as to cover an entire top surface and all side surfaces of the lower electrode.

16. The capacitive element as claimed in claim 15, further comprising a protective film that is provided so as to cover a surface of the upper electrode.

* * * * *